(12) United States Patent
Hsu et al.

(10) Patent No.: US 8,873,248 B2
(45) Date of Patent: Oct. 28, 2014

(54) DECORATION PLATE AND ELECTRONIC APPARATUS HAVING THE SAME

(75) Inventors: Fu-Min Hsu, Taichung County (TW); Chih-Jung Teng, Taichung (TW); Kuo-Chang Su, Tainan County (TW); Chin-Liang Chen, Taichung (TW)

(73) Assignees: Dongguan Masstop Liquid Crystal Display Co., Ltd., Guangdong Province (CN); Wintek Corporation, Taichung (TW)

( * ) Notice: Subject to any disclaimer, the term of this patent is extended or adjusted under 35 U.S.C. 154(b) by 145 days.

(21) Appl. No.: 13/303,147

(22) Filed: Nov. 23, 2011

(65) Prior Publication Data

US 2012/0127686 A1    May 24, 2012

(30) Foreign Application Priority Data

Nov. 24, 2010    (TW) .............................. 99140580 A

(51) Int. Cl.
  *H05K 1/14*        (2006.01)
  *H05K 5/02*        (2006.01)

(52) U.S. Cl.
  CPC .................................. *H05K 5/0243* (2013.01)
  USPC .................. 361/800; 361/679.3; 361/679.56; 361/807; 361/816

(58) Field of Classification Search
  CPC ..... H05K 5/0243; H05K 5/0239; H05K 5/03; H05K 7/04
  USPC ......... 361/679.56, 679.3, 800, 799, 796, 816, 361/818, 769.21, 769.22, 752, 750, 751, 361/772, 780, 679.21, 679.22, 807; 345/156–184
  See application file for complete search history.

(56) References Cited

U.S. PATENT DOCUMENTS

| | | | |
|---|---|---|---|
| 6,198,362 B1 * | 3/2001 | Harada et al. ................... 333/12 |
| 6,984,136 B2 * | 1/2006 | Yu .................................... 439/92 |
| 8,184,105 B2 * | 5/2012 | Lin et al. ........................ 345/173 |
| 8,279,198 B2 * | 10/2012 | Hsih ............................. 345/174 |
| 8,294,677 B2 * | 10/2012 | Wu et al. ....................... 345/173 |
| 8,300,194 B2 * | 10/2012 | Chen et al. .................... 349/149 |
| 8,405,963 B2 * | 3/2013 | Liu ........................... 361/679.21 |

(Continued)

FOREIGN PATENT DOCUMENTS

| | | |
|---|---|---|
| CN | 2641994 | 9/2004 |
| CN | 2687707 | 3/2005 |

(Continued)

OTHER PUBLICATIONS

"Office Action of Taiwan Counterpart Application", issued on Mar. 22, 2013, p. 1-p. 7, in which the listed references were cited.

(Continued)

*Primary Examiner* — Lisa Lea Edmonds
*Assistant Examiner* — Christopher L Augustin
(74) *Attorney, Agent, or Firm* — Jianq Chyun IP Office

(57) ABSTRACT

A decoration plate and an electronic apparatus having the same are provided. The decoration plate includes a cover plate, a conductive ring, an insulating layer, and a conductive element. The conductive ring is disposed on a surface of the cover plate. The insulating layer is disposed on the surface of the cover plate and covers the conductive ring, and the insulating layer has at least one opening. The conductive element is disposed in the opening.

6 Claims, 10 Drawing Sheets

(56) References Cited

U.S. PATENT DOCUMENTS

| | | | |
|---|---|---|---|
| 2002/0144032 A1* | 10/2002 | Kriege et al. | 710/62 |
| 2004/0095335 A1* | 5/2004 | Oh et al. | 345/173 |
| 2009/0161334 A1* | 6/2009 | Liao et al. | 361/818 |
| 2009/0256820 A1* | 10/2009 | Yanase et al. | 345/174 |
| 2010/0026927 A1* | 2/2010 | Jee et al. | 349/58 |
| 2011/0227838 A1* | 9/2011 | Jeon et al. | 345/173 |
| 2011/0285640 A1* | 11/2011 | Park et al. | 345/173 |
| 2012/0113050 A1* | 5/2012 | Wang et al. | 345/174 |

FOREIGN PATENT DOCUMENTS

| | | |
|---|---|---|
| CN | 1755454 | 4/2006 |
| JP | 9231007 | 9/1997 |
| TW | 200901013 | 1/2009 |
| TW | M348280 | 1/2009 |
| TW | M375934 | 3/2010 |
| TW | M379827 | 5/2010 |

OTHER PUBLICATIONS

"Office Action of China Counterpart Application", issued on May 27, 2014, pp.1-6.

* cited by examiner

DECORATION PLATE AND ELECTRONIC APPARATUS HAVING THE SAME

CROSS-REFERENCE TO RELATED APPLICATION

This application claims the priority benefit of Taiwan application serial no. 99140580, filed on Nov. 24, 2010. The entirety of the above-mentioned patent application is hereby incorporated by reference herein and made a part of this specification.

BACKGROUND OF THE INVENTION

1. Field of the Invention

The present invention generally relates to an electronic apparatus, in particular, to an electronic apparatus capable of effectively preventing damages caused by electrostatic discharge (ESD).

2. Description of Related Art

In the delay life environment, the electrostatic discharge (ESD) phenomenon can be seen everywhere. Basically, due to different electric affinities of different objects, charge transfer between objects likely occurs when any two objects are separated after contact, thus resulting in electrostatic charge accumulation. Once the electrostatic charges in an object accumulate to a certain degree, when the object with electrostatic charges contacts or gets close to another object of different potential, transient charge transfer will occur, which is the so-called ESD.

Specifically, electronic products are easily damaged by ESD in manufacturing, production, assembly, transportation, and even in use after being purchased by users. Therefore, electronic products must have an ESD protection design, to effectively prolong the service life. Especially, for the products fabricated through advanced semiconductor processes, such as integrated circuits (ICs) and planar displays, the size of the elements is very small. Therefore, when the elements are subjected to high-voltage ESD, wires inside the ICs or the planar displays are likely to be permanently damaged, and leading to element failure.

SUMMARY OF THE INVENTION

Accordingly, the present invention is directed to a decoration plate, which is capable of providing an ESD protection.

The present invention provides an electronic apparatus, which is capable of preventing damages caused by ESD.

The present invention provides a decoration plate, which includes a cover plate, a conductive ring, an insulating layer, and a conductive element. The conductive ring is disposed on a surface of the cover plate. The insulating layer is disposed on the surface of the cover plate and covering the conductive ring, and the insulating layer has at least one opening. The conductive element is disposed in the opening.

The present invention further provides an electronic apparatus, which includes a panel, a conductive housing, a cover plate, a conductive ring, an insulating layer, and a conductive element. The panel has a display surface. The conductive housing encloses the panel and exposes the display surface of the panel. The cover plate is disposed on the conductive housing and is located above the display surface. The conductive ring is disposed on the cover plate. The insulating layer is disposed on the cover plate, located between the conductive housing and the conductive ring, and covers the conductive ring, in which the insulating layer has an opening. The conductive element is disposed in the opening, and the conductive ring is electrically connected to the conductive housing through the conductive element.

Based on the above, in the present invention, a decoration layer and a conductive ring are disposed on a cover plate of an electronic apparatus to form a decoration plate, and the conductive ring is electrically connected to the conductive housing of the electronic apparatus. Thus, the electronic apparatus may have good ESD protection capability, which facilitates the improvement of the service life of the electronic apparatus.

In order to make the aforementioned and other objectives and advantages of the present invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
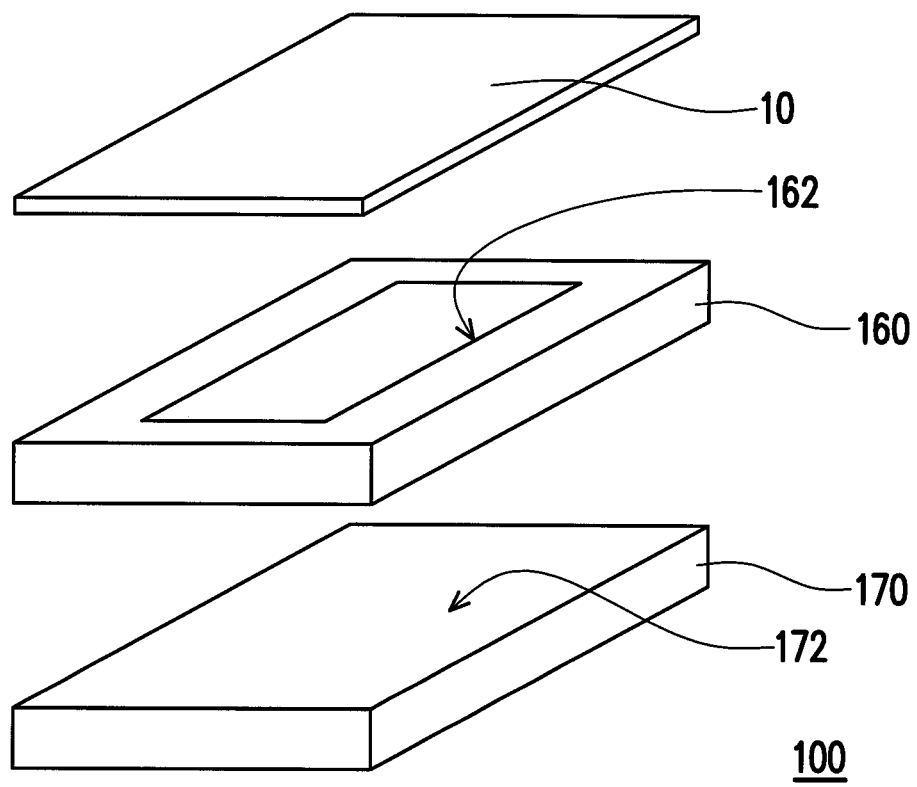
FIG. 1A is a schematic exploded view of an electronic apparatus according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 1B:
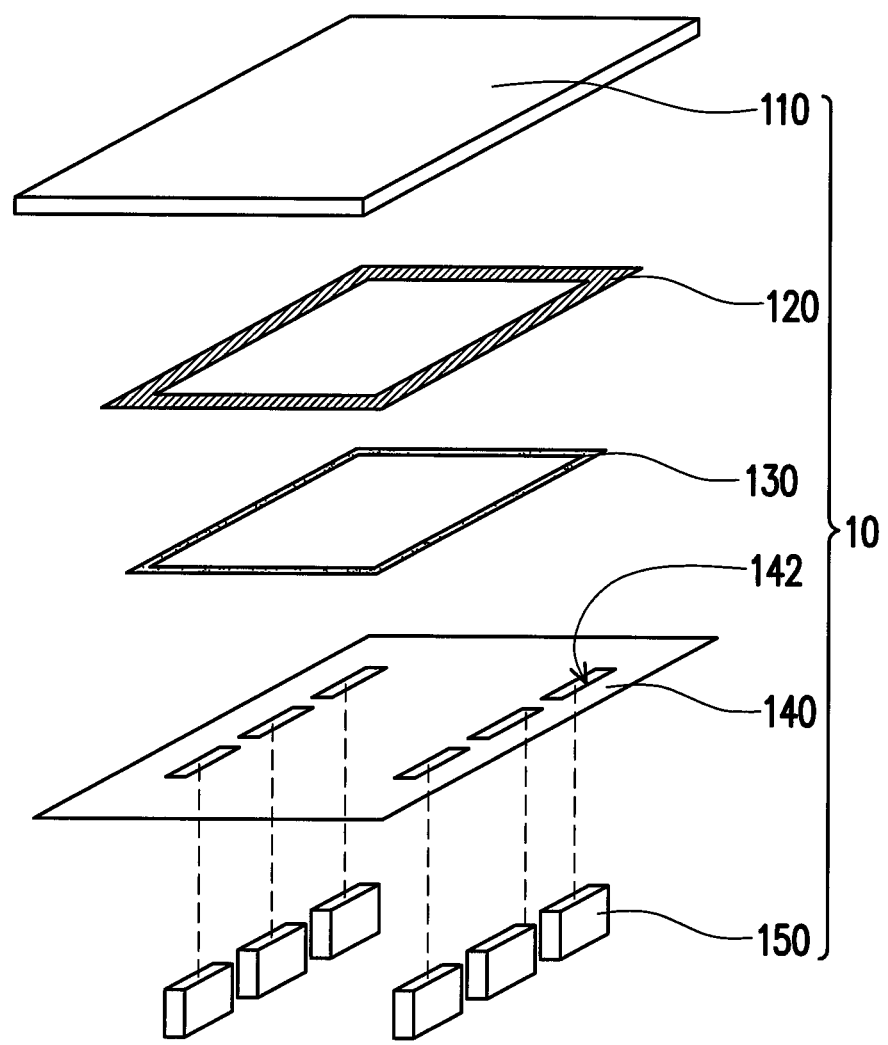
FIG. 1B shows a film layer stacking order of a decoration plate in the electronic apparatus in FIG. 1A.
Figure 2:
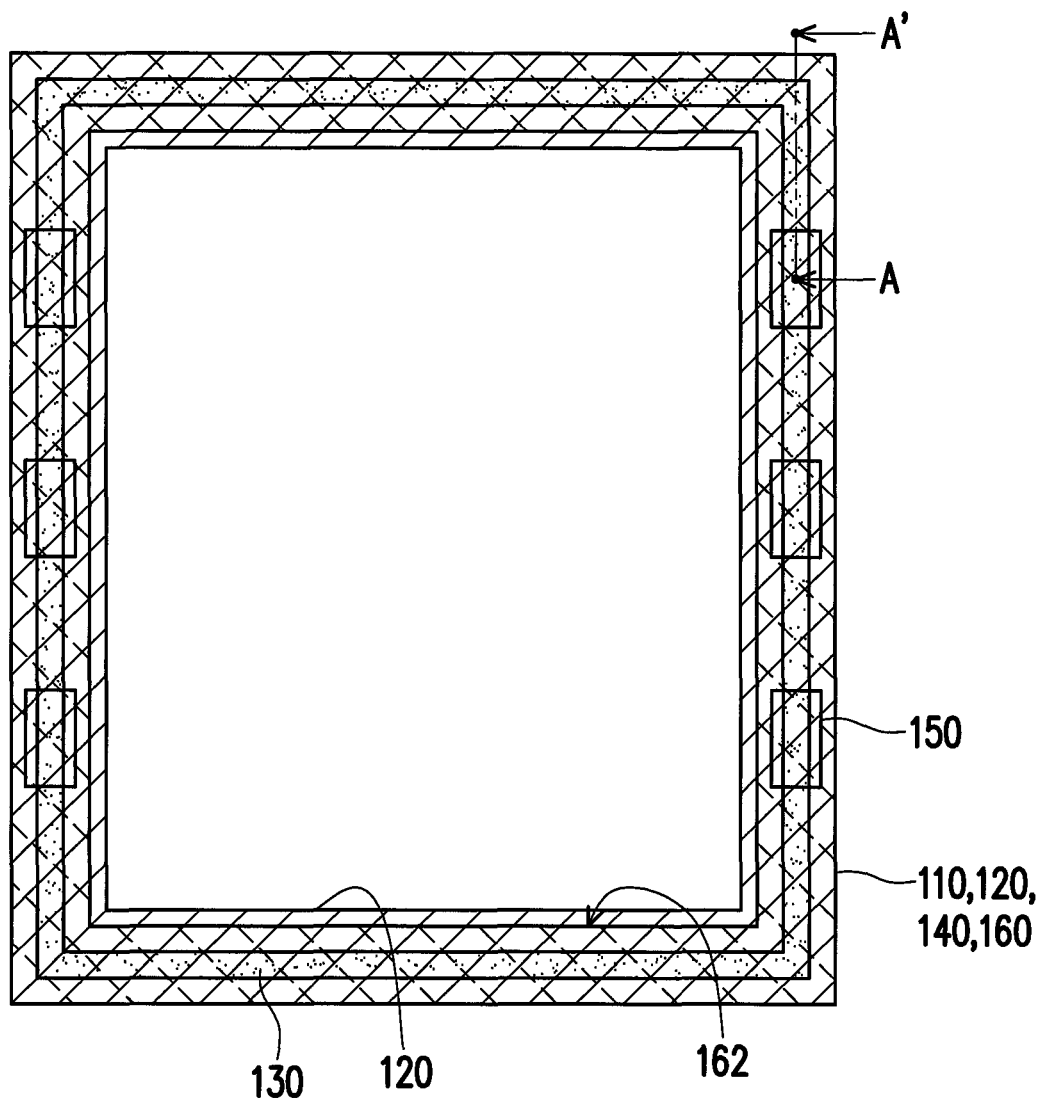
FIG. 2 is a top perspective view of the decoration plate and a conductive housing in the electronic apparatus in FIG. 1.
Figure 3:
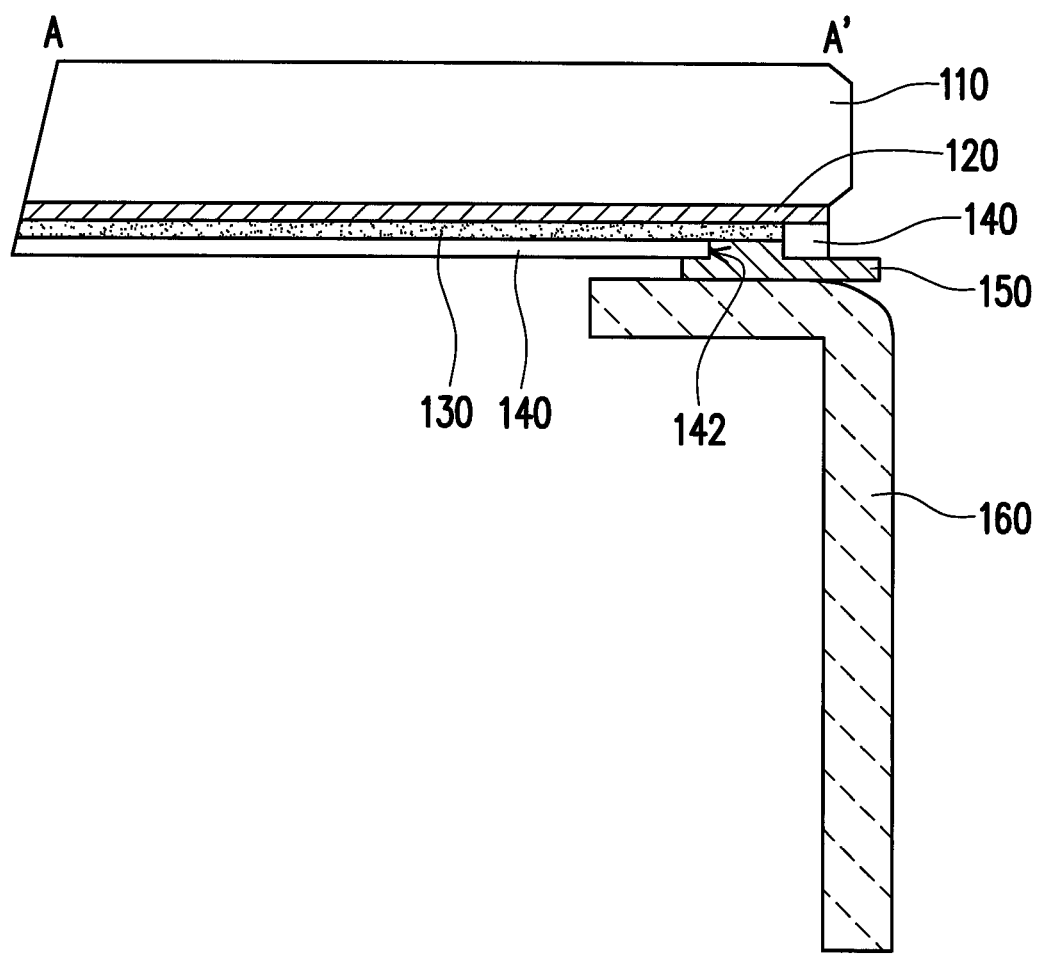
FIG. 3 shows a cross-sectional structural design along a line A-A' in FIG. 2.

FIG. 1A is a schematic exploded view of an electronic apparatus according to an embodiment of the present invention, and FIG. 1B shows a film layer stacking order of a decoration plate in the electronic apparatus in FIG. 1A. FIG. 2 is a top perspective view of the decoration plate and a conductive housing in the electronic apparatus in FIG. 1. FIG. 3 shows a cross-sectional structural design along a line A-A' in FIG. 2.

Referring to FIGS. 1A, 1B, 2, and 3, an electronic apparatus 100 includes a decoration plate 10, a conductive housing 160, and a panel 170. As shown in FIG. 1B, the decoration plate 10 includes a cover plate 110, a decoration layer 120, a conductive ring 130, an insulating layer 140, and a conductive element 150. The material of the cover plate 110 is, for example, glass or plastic. The panel 170 has a display surface 172, and the panel 170 is, for example, a display panel, a touch panel, or a touch display panel, in which the display panel is, for example, a liquid crystal display (LCD), an organic lightemitting diode display, an electro-wetting display, or a bistable display. The panel 170 and the conductive housing 160 are individually shown as independent components, but when being assembled together, the conductive housing 160 may enclose the panel 170 and expose the display surface 172 of the panel 170. That is to say, the conductive housing 160 has an accommodation space 162 to accommodate and protect the panel 170.

The cover plate 110 of the decoration plate 10 is disposed on the conductive housing 160 and is located above display surface 172, and the decoration layer 120 and the conductive ring 130 are disposed on a surface of the cover plate 110 and are located at a side of the cover plate 110 close to the conductive housing 160. Alternately, the decoration layer 120 may also be selectively disposed at a side of the cover plate 110 away from the conductive housing 160. The insulating layer 140 is disposed on the cover plate 110, and is located between the conductive housing 160 and the conductive ring 130, the insulating layer 140 covering the conductive ring 130 has at least one opening 142, and the conductive element 150 is disposed in the opening 142, such that the conductive ring 130 is electrically connected to the conductive housing 160 through the conductive element 150.

Specifically, the conductive element 150 may be a conductive glue, for example, an anisotropic conductive glue, a conductive plug, or a short metal pillar, such that the conductive ring 130 is electrically connected to the conductive housing 160 through the conductive element 150. When the electronic apparatus 100 has undesired electrostatic charge accumulation, the electrostatic charges may be transferred to the conductive housing 160 through the conductive ring 130 and the conductive element 150 for release. Therefore, the electrostatic charges in the electronic apparatus 100 is not liable to be accumulated and the ESD phenomenon is prevented, thereby reducing the risk of element damage and prolonging the service life.

The amount and the shape of the opening 142 in the insulating layer 140 and the amount and the shape of the conductive element 150 are not specifically limited. As long as the opening 142 is disposed in the insulating layer 140 for facilitating the conductive ring 130 electrically connected to conductive housing 160 through the conductive element 150 in the opening 142, the design will conform to the spirit of the present invention.

The decoration layer 120 of this embodiment may be an annular pattern formed by an opaque ink or other non-transparent materials such as ceramic materials. The area of the decoration layer 120 may cover the conductive ring 130 and a part of the conductive housing 160 to prevent a user from directly seeing the conductive ring 130 and the conductive housing 160 in a top view, which facilitates the improvement of the appearance of the electronic apparatus 100.

Figure 4:
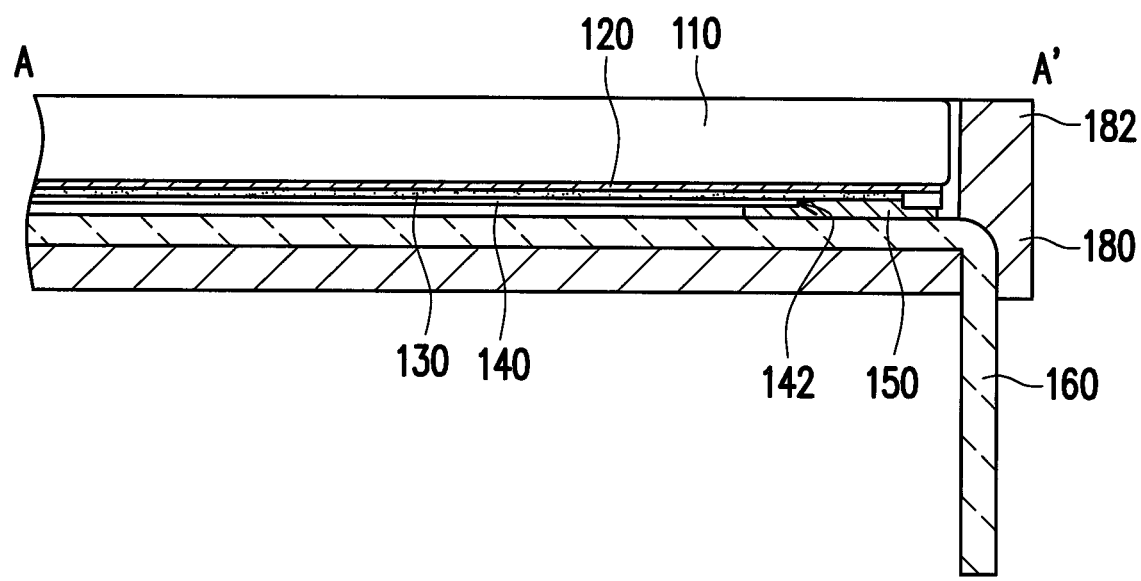
FIG. 4 shows another cross-sectional structural design along a line A-A' in FIG. 2.

In addition to the components mentioned above, the electronic apparatus 100 in FIG. 1 may further include a plastic housing 180 shown in FIG. 4. FIG. 4 shows another cross-sectional structural design along a line A-A' in FIG. 2. Referring to FIG. 4, the relative position of the cover plate 110, the decoration layer 120, the conductive ring 130, the insulating layer 140, the conductive element 150, and the conductive housing 160 is substantially [[as]] the same as that in the design shown in FIG. 3. In the design of this embodiment, the conductive housing 160 may be combined with a plastic housing 180 through integral injection, such that part of the conductive housing 160 is formed between the cover plate 110 and the plastic housing 180, and the plastic housing 180 has a side wall 182 surrounding the cover plate 110. Nevertheless, the present invention does not limit the assembly type of the electronic apparatus in the housing. As long as the conductive ring 130 has the conductive housing 160 and is electrically connected to the cover plate 110, the ESD protection design may be realized, which facilitates the improvement of the reliability and the service life of the whole device. Therefore, the cross-sectional designs mentioned above are merely illustrated as examples, but not intended to limit the present invention.

Figure 5A:
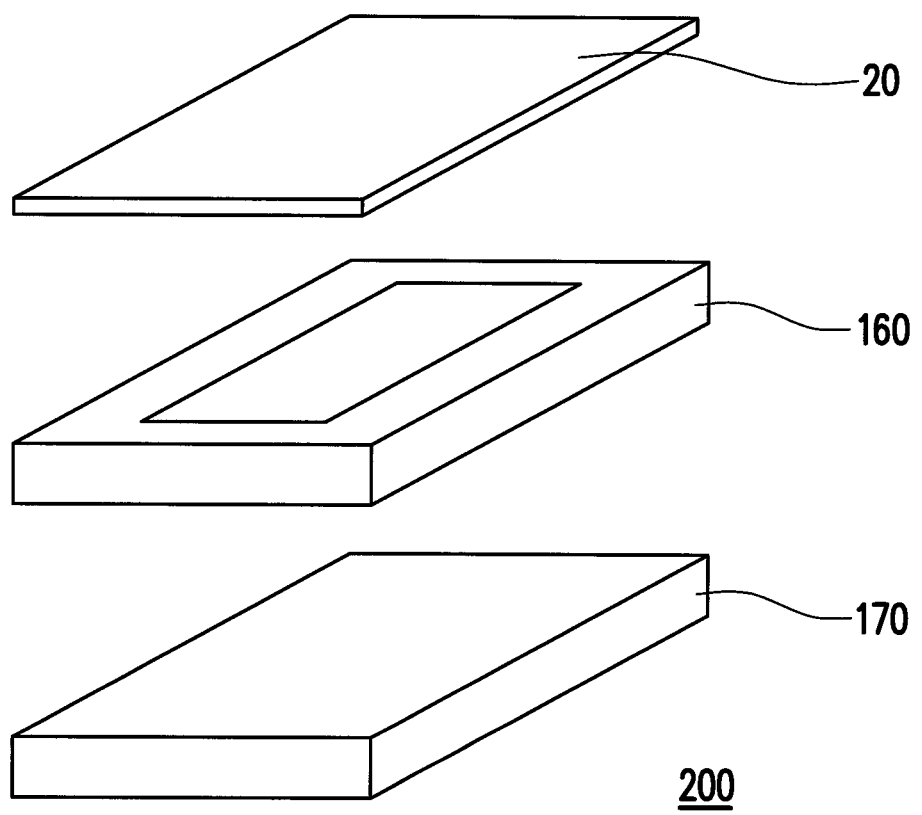
FIG. 5A is a schematic exploded view of an electronic apparatus according to another embodiment of the present invention.
Figure 5B:
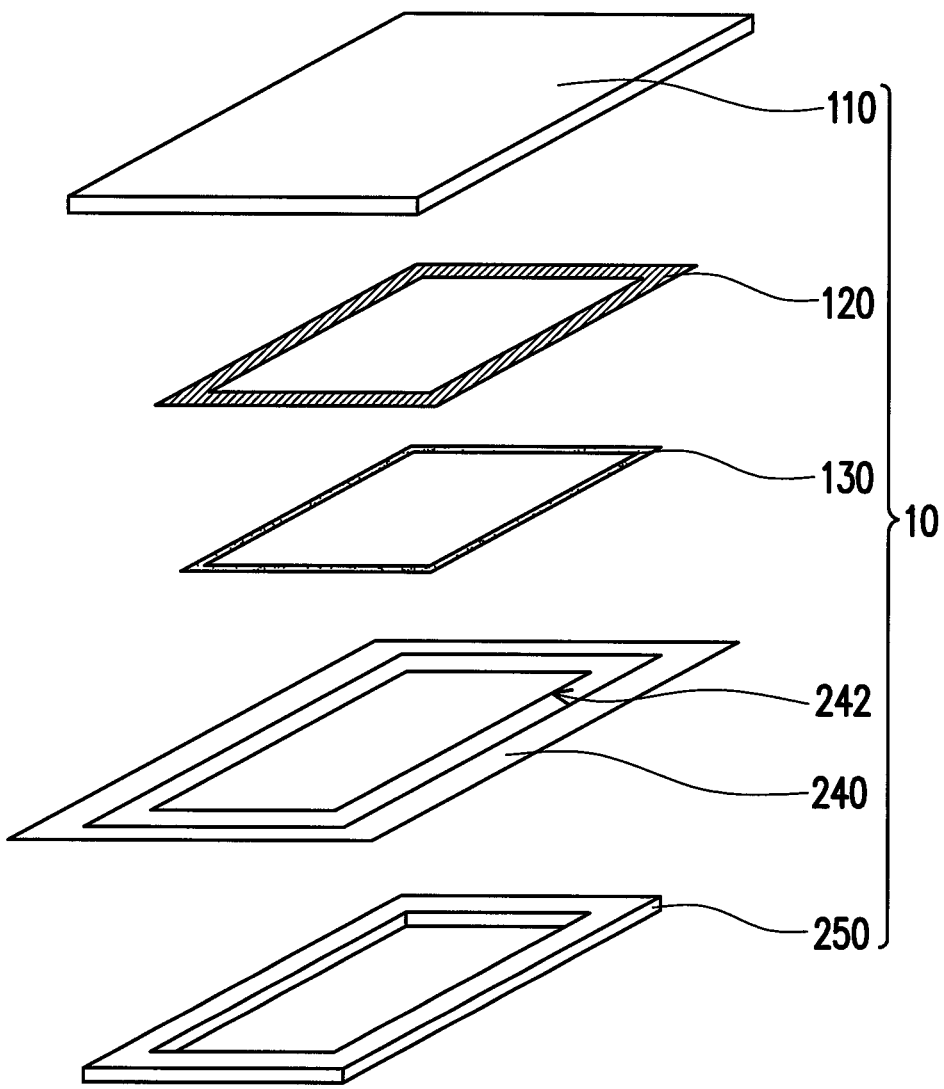
FIG. 5B shows a film layer stacking order of a decoration plate in the electronic apparatus in FIG. 5A.

Additionally, FIG. 5A is a schematic exploded view of an electronic apparatus according to another embodiment of the present invention, and FIG. 5B shows a film layer stacking order of a decoration plate in the electronic apparatus in FIG. 5A. Referring to FIGS. 5A and 5B, an electronic apparatus 200 is substantially similar to the electronic apparatus 100, so element labels of part components in FIGS. 5A and 5B are the same as those in FIGS. 1A and 1B, and the same element labels represent the same components. In this embodiment, in an insulating layer 240 of a decoration plate 20, an opening 242 forms, for example, an annular pattern, to substantially expose the conductive ring 130 completely. Moreover, in this embodiment, an annular conductive pattern serves a conductive element 250, such that the conductive ring 130 is electrically connected to the conductive housing 160 through the conductive element 250 in the opening 242. In general, the present invention does not limit the shape of the opening 242, and no matter the opening 242 partially or completely exposes the conductive ring 130, the conductive ring 130 can be electrically connected to the conductive housing 160 through the conductive element 250 in the opening 242, so as to achieve the ESD protection effect.

Figure 6:
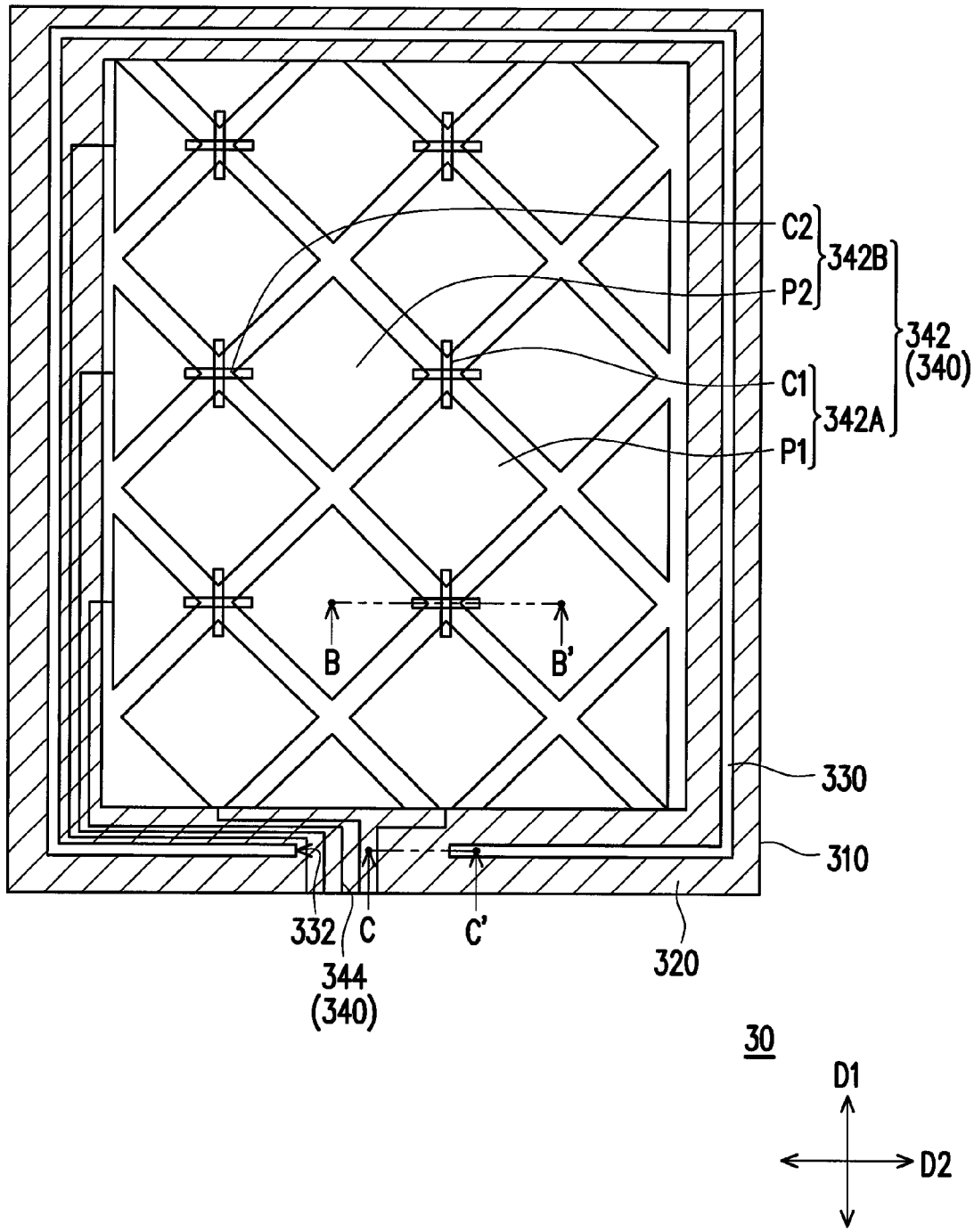
FIG. 6 is a top schematic view of a decoration plate.

Furthermore, other elements may further disposed on the cover plate through other implementation manners. FIG. 6 is a top schematic view of a decoration plate. Referring to FIG. 6, a decoration plate 30 includes a cover plate 310 and the elements disposed on the cover plate 310 including a decoration layer 320, a conductive ring 330, and a touch element 340. Taking this embodiment as an example, the touch element 340 includes a sensing electrode 342 and at least one transmission wire 344 connected to the sensing electrode 342, in which the sensing electrode 342 is located inside a region surrounded by the conductive ring 330, and the conductive ring 330 has a gap 332 such that the transmission wire 344 is partially located in the gap 332.

The sensing electrode 342 includes a plurality of first sensing series 342A and a plurality of second sensing series 342B. Each first sensing series 342A extends in a first direction D1, each second sensing series 342B extends in a second direction D2, and the first direction D1 and the second direction D2 are different from each other. Specifically, the first direction D1 and the second direction D2 may be perpendicular to each other, or intersect at an angle not equal to zero degree.

Each of the first sensing series 342A includes a plurality of sensing pads P1 and a plurality of connecting lines C1 for connecting the sensing pads P1 together in series in the first direction D1. Similarly, each of the second sensing series 342B includes a plurality of sensing pads P2 and a plurality of connecting lines C2 for connecting the sensing pads P2 together in series in the second direction D2. As for this embodiment, capacitance changes sensed by the sensing pads P1 and the sensing pads P2 may serve as a reference for determining the touch position. Moreover, one end of the transmission wire 344 is connected to the first sensing series 342A or the second sensing series 342B, and the other end is extended to a periphery of the cover plate 310, so as to transfer a signal of the first sensing series 342A or the second sensing series 342B to an outer circuit. In addition, the transmission wire 344 may also transfer a scanning signal output from the outer circuit to the first sensing series 342A or the second sensing series 342B.

The touch element 340 is, for example, a projected capacitive touch element. However, the present invention does not limit that the sensing electrode 342 should be formed by a plurality of sensing series, and in other embodiments, the sensing electrode 342 may be formed by a plurality of strip insulating patterns or a whole conductive layer. In addition, one transmission wire 344 or a plurality of transmission wires 344 may exist. It should be noted that, the conductive ring 330 has the gap 332, to prevent the operation of the touch element 340 from being negatively influenced due to electrical connection of the transmission wire 344 and the conductive ring 330.

Generally, with different process steps, many designs exist in the cross-sectional structure of the touch element 340. For example, FIGS. 7 to 10 are cross-sectional structural designs along a line B-B' and a line C-C' in FIG. 6. First, referring to FIGS. 6 and 7 together, in addition to the decoration layer 320, the conductive ring 330, and the touch element 340, an island insulating pattern I1, an insulating layer 350, and a conductive element 360 are further disposed on the decoration plate 30. The island insulating pattern I1 is disposed between the connecting lines C1 and the connecting lines C2. The insulating layer 350 covers the decoration layer 320, the conductive ring 330, and the touch element 340, and has an opening 352 for exposing the conductive ring 330. Moreover, the conductive element 360 is disposed in the opening 352 to achieve the ESD protection. In other words, the structure shown in FIG. 7 may be disposed on a conductive housing of an electronic apparatus to provide the ESD protection effect.

It can be know from the cross-sectional structure that, the sensing pads P2 of the second sensing series 342B and, for example, the connecting lines C1 of the first sensing series 342A are coplanarly disposed on the cover plate 310. In addition, although the sensing pads P1 of the first sensing series 342A are not shown in FIG. 7, in this embodiment, the sensing pads P1 and the connecting lines C1 may be coplanarly disposed on the cover plate 310. In other words, the connecting lines C1 and the sensing pads P1 of the first sensing series 342A and the sensing pads P2 of the second sensing series 342B may be formed by patterning the same transparent conductive layer. The connecting lines C1 and the connecting lines C2 are separated by the island insulating pattern I1 to maintain electrically independent to each other.

Additionally, materials of the connecting lines C2, the transmission wire 344, and the conductive ring 330 are all, for example, metal materials. In this embodiment, the connecting lines C2, the transmission wire 344, and the conductive ring 330 may be formed by patterning the same metal layer. Thus, this embodiment does not need an additional process to fabricate the conductive ring 330. Furthermore, the present invention does not limit to the implementation that the decoration layer 320 is fabricated between the cover plate 310 and the transmission wire 344. In other embodiments, the decoration layer 320 may be selectively fabricated at a side of the cover plate 310 away from the transmission wire 344.

Figure 7:
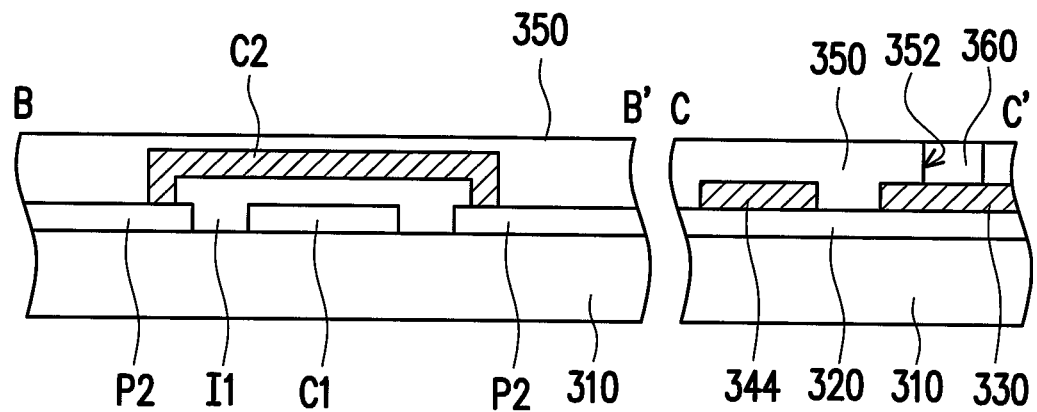
FIGS. 7 to 10 are cross-sectional structural designs along a line B-B' and a line C-C' in FIG. 6.
Figure 8:
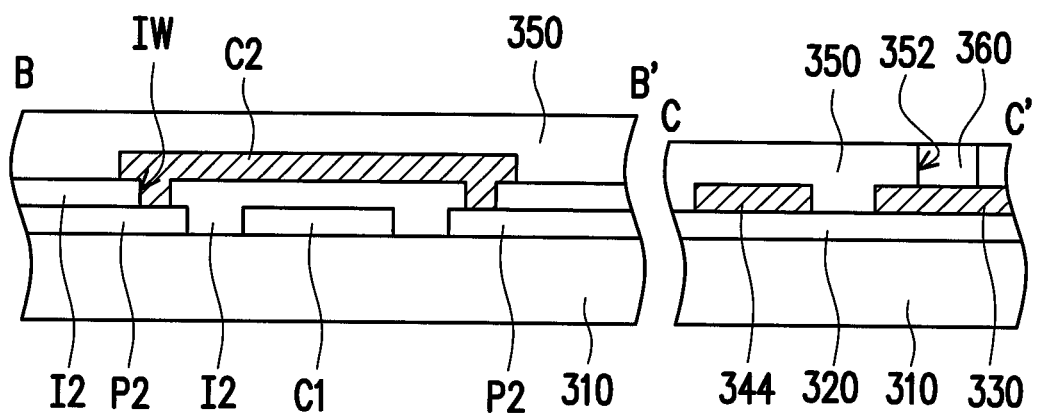

Next, referring to FIG. 8, the structural design of this embodiment is substantially similar to that shown in FIG. 7, and the main difference lies in that the design shown in FIG. 8 replaces the island insulating pattern I1 shown in FIG. 7 with an insulating layer I2. At this time, the insulating layer I2 substantially covers the connecting lines C1 and the sensing pads P2, and the insulating layer I2 has a contact opening IW to partially expose the sensing pads P2. Thus, the connecting lines C2 are electrically connected to the sensing pads P2 through the contact opening IW.

Figure 9:
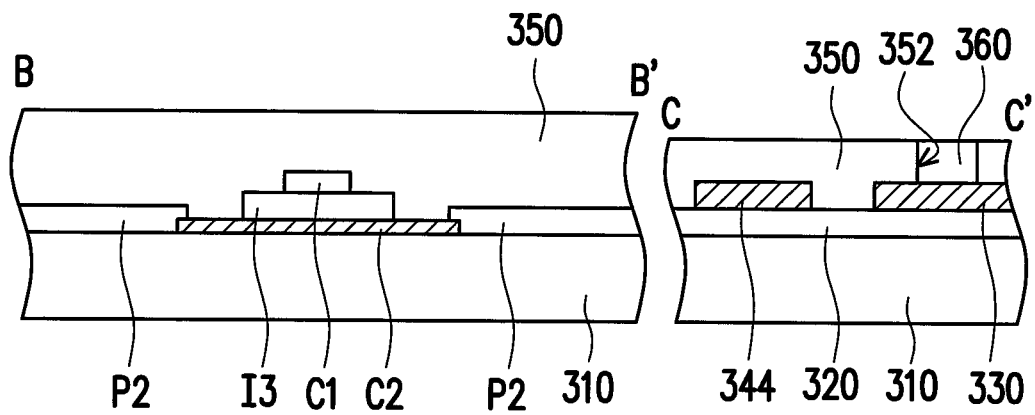

Furthermore, referring to FIGS. 6 and 9 together, according to this embodiment, when fabricating the touch element, the decoration layer 320 can be first formed. Next, the connecting lines C2 and the sensing pads P2 of the second sensing series 342B are sequentially fabricated on the cover plate 310. Then, an island insulating pattern I3 is fabricated on the connecting lines C2. Afterwards, the connecting lines C1 of the first sensing series 342A are fabricated on the island insulating pattern I3. Finally, the insulating layer 350 and the opening 352 in the insulating layer 350 are formed. When the sensing pads P2 are fabricated, the sensing pads P1 of the first sensing series 342A may be simultaneously fabricated on the cover plate 310 at the same time. Thus, the sensing pads P1 and the sensing pads P2 may be designed to be coplanar.

It should be noted that, in this embodiment, when the connecting lines C2 are fabricated, the transmission wire 344 and the conductive ring 330 may be fabricated at the same time. Therefore, the connecting lines C2, the transmission wire 344, and the conductive ring 330 may be made of the same material and may also be the same film layer. Certainly, the conductive element 360 may be disposed in the opening 352 in the insulating layer 350, such that the conductive ring 330 is electrically connected to an external element (for example, the conductive housing of the electronic apparatus). Furthermore, the present invention does not limit the implementation that the decoration layer 320 is fabricated between the cover plate 310 and the transmission wire 344. In other embodiments, the decoration layer 320 may be selectively fabricated at a side of the cover plate 310 away from the transmission wire 344.

Figure 10:
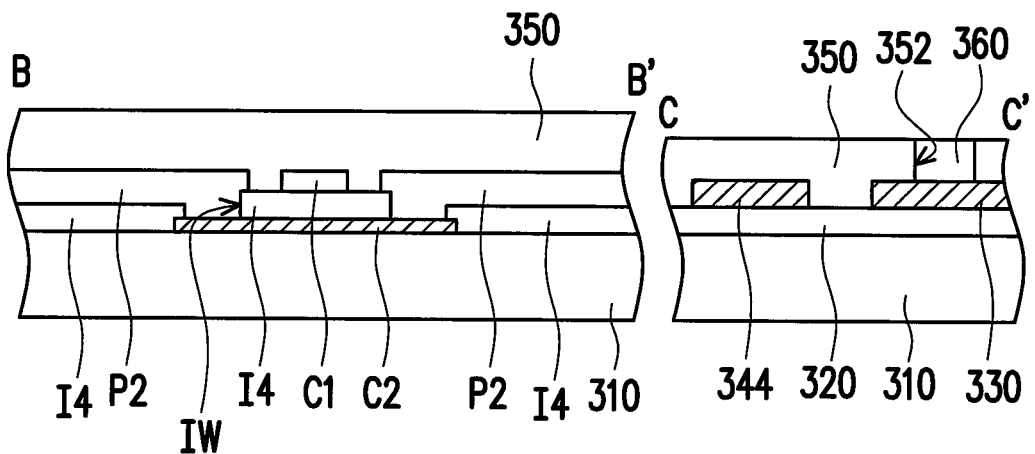

Next, referring to FIG. 10, the structural design of this embodiment is substantially similar to that shown in FIG. 7, and the main difference lies in that the deign shown in FIG. 10 replaces the island insulating pattern I3 shown in FIG. 7 with an insulating layer I4. At this time, the insulating layer I4 is substantially disposed between the sensing pads P2 and the cover plate 310, and the insulating layer I4 has a contact opening IW to partially expose the connecting lines C2. Thus, the sensing pads P2 are electrically connected to the connecting lines C2 through the contact opening IW. In other words, in this embodiment, after the connecting lines C2, the transmission wire 344, and the conductive ring 330 are fabricated, the insulating layer 14 is completely formed on the cover plate 310. Next, the contact opening IW is formed on the cover plate 310, and then the sensing pads P1 (not shown in FIG. 10), the sensing pads P2, and the connecting lines C1 are fabricated. Finally, the insulating layer 350 and the opening 352 are formed to complete the fabrication of the touch element and the conductive ring 330.

In view of the above, in the electronic apparatus of the present invention, the conductive ring is disposed on the cover plate, and the conductive ring is electrically connected to the conductive housing. Once the electronic apparatus has undesired electrostatic charge accumulation, the electrostatic charges may be transferred to the conductive housing through the conductive ring for release. Thus, the electronic apparatus has good ESD protection capability, which facilitates the improvement of the service life of the electronic apparatus.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic apparatus, comprising:
a cover plate;
a decoration layer, disposed on the cover plate;
a conductive ring, disposed on a surface of the cover plate, wherein the conductive ring and the decoration layer are located at a same side of the cover plate;
an insulating layer, disposed on the surface of the cover plate, covering the conductive ring, and having at least one opening;
at least one conductive element, disposed in the opening;
a panel, having a display surface and disposed on the surface of the cover plate facing the insulating layer; and
a conductive housing, disposed on a surface of the insulating layer and enclosing the panel to expose the display surface of the panel, and the conductive ring is electrically connected to the conductive housing through the conductive element.

2. The electronic apparatus according to claim 1, wherein the panel is a display panel, a touch panel, or a touch display panel.

3. The electronic apparatus according to claim 1, further comprising a plastic housing, combined the conductive housing through integral injection, wherein a part of the conductive housing is formed between the cover plate and the plastic housing, and the plastic housing is provided with a side wall surrounding the cover plate to foim an accommodation space to accommodate the cover plate, the conductive ring, the insulating layer, and the conductive element.

4. The electronic apparatus according to claim 1, further comprising a touch element disposed on the cover plate and comprising a sensing electrode and at least one transmission wire connected to the sensing electrode, wherein the sensing electrode is located in a region surrounded by the conductive ring.

5. The electronic apparatus according to claim 4, wherein the transmission wire and the conductive ring are a same film layer, and the conductive ring having a gap in which the transmission wire is located.

6. The electronic apparatus according to claim 4, wherein the sensing electrode comprises a plurality of first sensing series and a plurality of second sensing series, each first sensing series extends in a first direction, each second sensing series extends in a second direction, and the first direction and the second direction are different from each other.

* * * * *